(12) United States Patent
Tolpygo et al.

(10) Patent No.: US 9,683,448 B2
(45) Date of Patent: Jun. 20, 2017

(54) LOW CONDUCTIVITY THERMAL BARRIER COATING

(71) Applicant: HONEYWELL INTERNATIONAL INC., Morristown, NJ (US)

(72) Inventors: Vladimir K. Tolpygo, Scottsdale, AZ (US); Wil Baker, Phoenix, AZ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 482 days.

(21) Appl. No.: 13/846,574

(22) Filed: Mar. 18, 2013

(65) Prior Publication Data

US 2014/0271218 A1 Sep. 18, 2014

(51) Int. Cl.
*F01D 5/28* (2006.01)
*C23C 14/08* (2006.01)
(Continued)

(52) U.S. Cl.
CPC .......... *F01D 5/288* (2013.01); *C04B 35/486* (2013.01); *C23C 14/083* (2013.01); *C23C 14/30* (2013.01); *C23C 28/042* (2013.01); *C23C 28/044* (2013.01); *C04B 2235/3206* (2013.01); *C04B 2235/3208* (2013.01); *C04B 2235/3224* (2013.01); *C04B 2235/3225* (2013.01); *C04B 2235/3229* (2013.01); *C04B 2235/3244* (2013.01); *C04B 2235/3246* (2013.01); *C04B 2235/3248* (2013.01); *C04B 2235/3251* (2013.01); *C04B 2235/76* (2013.01)

(58) Field of Classification Search
CPC ....... F01D 5/288; C23C 28/042; C23C 28/30; C23C 28/3215; C23C 14/083; C23C 14/30; C04B 2235/3224; C04B 2235/3225; C04B 2235/3244; C04B 2235/3246; C04B 2235/3248
See application file for complete search history.

(56) References Cited

U.S. PATENT DOCUMENTS 4,321,310 A 3/1982 Ulion et al.
4,321,311 A 3/1982 Strangman
(Continued)

FOREIGN PATENT DOCUMENTS

EP 1400611 A1 3/2004
EP 2269966 A2 1/2011
(Continued)

OTHER PUBLICATIONS

EP Search Report for Application No. 14160165.8, Dated Jun. 25, 2014.
(Continued)

*Primary Examiner* — Jonathan Langman
(74) *Attorney, Agent, or Firm* — Lorenz & Kopf, LLP

(57) ABSTRACT

A ceramic composition of matter includes a solvent material and a solute material. The solvent material comprises zirconia or hafnia, or a mixture thereof, which is stabilized with a stabilizing oxide. The solute material comprises a metal oxide of the formula, $X_aO_b$, where X is a metallic element, O is oxygen, and "a" and "b" are stoichiometric coefficients. The difference in density between the solvent material and the solute material is less than about 30%.

14 Claims, 1 Drawing Sheet

(51) Int. Cl.
*C23C 14/30* (2006.01)
*C23C 28/04* (2006.01)
*C04B 35/486* (2006.01)

(56) References Cited

U.S. PATENT DOCUMENTS

| | | | |
|---|---|---|---|
| 4,401,697 | A | 8/1983 | Strangman |
| 4,405,659 | A | 9/1983 | Strangman |
| 5,238,752 | A | 8/1993 | Duderstadt et al. |
| 5,514,482 | A | 5/1996 | Strangman |
| 6,461,108 | B1 | 10/2002 | Lee et al. |
| 6,482,437 | B2 | 11/2002 | Debregeas et al. |
| 6,482,537 | B1 | 11/2002 | Strangman et al. |
| 6,586,115 | B2 | 7/2003 | Rigney et al. |
| 6,686,060 | B2 | 2/2004 | Bruce et al. |
| 6,803,135 | B2 | 10/2004 | Liu et al. |
| 6,890,668 | B2 * | 5/2005 | Bruce et al. ............ 428/632 |
| 7,087,266 | B2 | 8/2006 | Darolia et al. |
| 7,785,671 | B2 * | 8/2010 | Matsumoto ........ C04B 35/486 427/255.23 |
| 7,859,100 | B2 | 12/2010 | Torigoe et al. |
| 7,862,901 | B2 | 1/2011 | Darolia et al. |
| 2003/0215665 | A1 | 11/2003 | Bruce et al. |
| 2005/0036891 | A1 | 2/2005 | Spitsberg et al. |
| 2006/0046090 | A1 | 3/2006 | Spitsberg et al. |
| 2007/0036997 | A1 | 2/2007 | Floyd et al. |
| 2010/0159150 | A1 | 6/2010 | Kirby et al. |
| 2010/0159262 | A1* | 6/2010 | Fu ....................... C23C 30/00 428/472 |
| 2010/0327213 | A1 | 12/2010 | Tolpygo |
| 2012/0195744 | A1 | 8/2012 | Naik et al. |

FOREIGN PATENT DOCUMENTS

| | | |
|---|---|---|
| WO | 0149892 A1 | 7/2001 |
| WO | 2011123432 A1 | 10/2011 |
| WO | 2012012431 A1 | 1/2012 |

OTHER PUBLICATIONS

EP Examination Report for Application No. 14160165.8, Dated Jul. 17, 2014.
Kim, D.; Effect of Ta2O5, Nb2O5, and HfO2, Alloying on the Transformability of Y2O3-Stabilized Tetragonal Zr2x; Department of Materials Science and Engineering, The University of Michigan, Manuscript No. 198740; J.Am. Ceram. Soc., 73 (1) 115-20 (1990).
Almeida, D.S., et al.; Electron Beam-Physical Vapour Deposition of Zirconia Co-Doped With YTTRIA and NIOBIA.
EP Examination for Application No. 14160165.8-1353 dated Oct. 16, 2015.

* cited by examiner

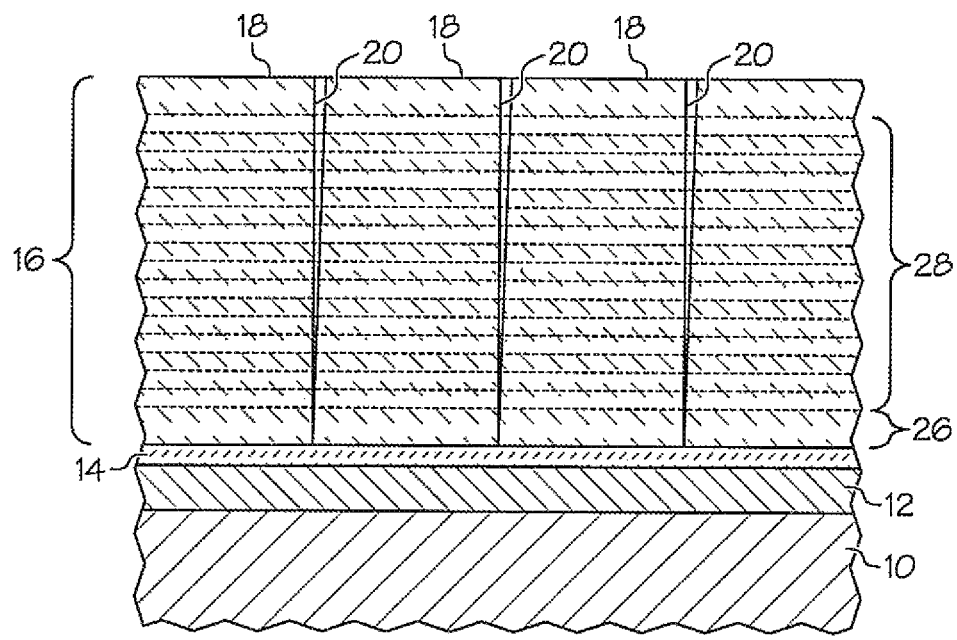

LOW CONDUCTIVITY THERMAL BARRIER COATING

TECHNICAL FIELD

The present disclosure relates generally to thermal barrier coatings for superalloy substrates and in particular to a multi-component, ceramic thermal barrier coating having low thermal conductivity for superalloy blades and vanes in gas turbine engines.

BACKGROUND

As gas turbine engine technology advances and engines are required to be more efficient, gas temperatures within the engines continue to rise. However, the ability to operate at these increasing temperatures is limited by the ability of the superalloy turbine blades and vanes to maintain their mechanical strength when exposed to the heat, oxidation, and corrosive effects of the impinging gas. One approach to this problem has been to apply a protective thermal barrier coating that insulates the blades and vanes and inhibits oxidation and hot gas corrosion.

Typically, thermal barrier coatings are applied to a superalloy substrate and include a bond coat and a ceramic top layer. The ceramic top layer is applied either by the process of plasma spraying or by the process of electron beam physical vapor deposition (EB-PVD). Use of the EB-PVD process results in the outer ceramic layer having a columnar microstructure. Gaps between individual columns allow the coating to expand and contract laterally upon thermal cycling without developing stresses that could cause spalling. Strangman, U.S. Pat. Nos. 4,321,311, 4,401,697, and 4,405,659 disclose thermal barrier coatings for superalloy substrates that contain a MCrAlY layer, an alumina layer, and an outer columnar grained ceramic layer. A more cost effective system is disclosed in Strangman U.S. Pat. No. 5,514,482, which teaches a thermal barrier coating for a superalloy substrate that contains an aluminide layer, an alumina layer, and an outer columnar ceramic layer. A low conductivity system is disclosed in Strangman U.S. Pat. No. 6,482,537. A thermal barrier coating for turbine engine components is disclosed in Tolpygo U.S. Pat. Appl. Pub. No. 2010/0327213, the disclosure of which is incorporated by reference herein in its entirety.

The ceramic layer is commonly zirconia stabilized with yttria. The prior art teaches that the amount of yttria can range from about 6 percent to about 35 percent of the layer. (See U.S. Pat. Nos. 5,238,752 and 4,321,310). It is also known in the prior art that cubic zirconia, which is zirconia stabilized with more than about 15 percent yttria, has lower thermal conductivity relative to tetragonal zirconia which is stabilized with about 6 to about 8 percent yttria. However, despite the disadvantage of higher thermal conductivity, most commercially available thermal barrier coatings use tetragonal zirconia stabilized with 7 to 8 weight percent yttria for the ceramic layer because it is more reliable due to its superior capability to resist spalling and particulate erosion.

The prior art further teaches a thermal barrier coating having a ceramic layer that has thermal conductivity less than or equal to that of cubic zirconia and resistance to spalling of tetragonal zirconia as well as a need for a method to make such a coating. (See U.S. Pat. No. 6,482,537). These advanced coatings contain other metal oxides in addition to zirconia and yttria. However, such systems have been found to be difficult to deposit on the superalloy substrates using EB-PVD process, leading to complicated coating recipes. The multi-component coatings often become locally enriched with or depleted by individual components (constituents), leading to chemistry variation within the coating, more specifically, across its thickness. Such chemical instability may adversely affect TBC properties and performance, for example, by inducing thermal expansion mismatch between coating layers having different compositions, or creating a particular combination of components susceptible to destructive phase transformation during service.

Accordingly, it is desirable to provide low conductivity thermal barrier coatings that do not suffer chemistry variations within the coating. More particularly, it is desirable to provide low conductivity thermal barrier coatings wherein their individual constituents maintain consistent concentrations across the coating thickness. This is especially important when the coating is deposited using EB-PVD process with all coating constituents being evaporated from a single source. Such a "single-source" method is more practical in comparison with other, more complicated coating recipes involving multiple evaporation sources. However, evaporation of several different oxides simultaneously from a single source often results in substantial variations of the coating composition because the composition of the vapor phase does not always remain stable during deposition. As such, it would be desirable to reduce compositional variations in EB-PVD TBCs. Furthermore, other desirable features and characteristics of the disclosure will become apparent from the subsequent detailed description and the appended claims, taken in conjunction with the accompanying drawing and this background of the disclosure.

BRIEF SUMMARY

In accordance with an exemplary embodiment, a ceramic composition of matter includes a solvent material and a solute material. The solvent material comprises zirconia or hafnia, or a mixture thereof, which is stabilized with a stabilizing oxide. The solute material comprises a metal oxide of the formula, $X_aO_b$, where X is a metallic element, O is oxygen, and "a" and "b" are stoichiometric coefficients. The difference in density between the solvent material and the solute material is less than about 30%. The ceramic composition of matter may be employed in aerospace applications, such as coatings for turbine airfoil, shroud, and combustor components.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present disclosure will hereinafter be described in conjunction with the following drawing figure:

FIG. 1 is a cross sectional schematic of a coated article having a thermal barrier coating as contemplated by one exemplary embodiment of the present disclosure.

DETAILED DESCRIPTION

The following detailed description is merely exemplary in nature and is not intended to limit the exemplary embodiments described herein or the application and uses of such embodiments. As used herein, the word "exemplary" means "serving as an example, instance, or illustration." Thus, any embodiment described herein as "exemplary" is not necessarily to be construed as preferred or advantageous over other embodiments. All of the embodiments and implementations of the thermal barrier coatings described herein are exemplary embodiments provided to enable persons skilled in the art to make or use the inventive coatings described herein and not to limit the scope of the invention, which is defined by the claims. Furthermore, there is no intention to be bound by any expressed or implied theory presented in the preceding technical field, background, brief summary, or the following detailed description.

Further, although certain embodiments described herein provide improved methods for coating gas turbine engine components, it will be appreciated that the methods and coatings described herein will be useful in any number of applications wherein high temperature resistance is desirable. In particular, the methods described herein may find application in any of various implementations where it is desirable to protect a superalloy from degradation due to exposure to gas temperatures, in particular high temperature gasses.

Referring to FIG. 1, a base metal or substrate 10 is provided as a nickel, cobalt, or iron based high temperature alloy from which turbine airfoils are commonly made. A bond coat 12 lies over the substrate 10. The bond coat 12 usually includes a MCrAlY alloy. Various MCrAlY alloys are well-known to those having ordinary skill in the art, and as such greater detail regarding such alloys is not provided herein. The MCrAlY bond coat is preferably applied by sputtering, low pressure plasma, or high velocity oxy fuel spraying.

Alternatively, the bond coat 12 can include an intermetallic aluminide such as nickel aluminide or platinum aluminide. The aluminide bond coat can be applied by standard commercially available processes whereby aluminum is reacted at the substrate surface to form an aluminum intermetallic compound, which provides a reservoir for the growth of an alumina scale oxidation resistant layer. Thus the aluminide coating is predominately composed of aluminum intermetallic (e.g., NiAl, CoAl and (Ni, Co) Al phases) formed by reacting aluminum vapor species, aluminum rich alloy powder or surface layer, with the substrate elements in the outer layer of the superalloy component. This layer is typically well bonded to the substrate. Aluminizing may be accomplished by one of several conventional prior art techniques, such as the pack cementation process, spraying, chemical vapor deposition, electrophoresis, sputtering, and appropriate diffusion heat treatments. Other beneficial elements can also be incorporated into diffusion aluminide coatings by a variety of processes. Beneficial elements include, for example, Pt, Pd, Si, Hf, Y and oxide particles, such as alumina, yttria, hafnia, for enhancement of alumina scale adhesion, Cr and Mn for hot corrosion resistance, Rh, Ta, and Nb for diffusional stability and/or oxidation resistance and Ni and Co for increasing ductility or incipient melting limits. In the specific case of platinum modified diffusion aluminide coating layers, the coating phases adjacent to the alumina scale will be platinum aluminide and/or nickel-platinum aluminide phases (on a Ni-base superalloy).

Through oxidation, an alumina (i.e., aluminum oxide) layer 14 is formed over the bond coat 12. This alumina layer 14 provides both oxidation resistance and a bonding surface for a ceramic top coat 16. The alumina layer may be formed before the ceramic coat 16 is applied, during application of coat 16, or subsequently by heating the coated article in an oxygen containing atmosphere at a temperature consistent with the temperature capability of the superalloy, or by exposure to the turbine environment. The sub-micron thick alumina scale will thicken on the aluminide surface by heating the material to normal turbine exposure conditions. The thickness of the alumina scale is preferably sub-micron (up to about one micron). Alternatively, the bond coat 12 may be eliminated if the substrate 10 is capable of forming a highly adherent alumina scale or layer 14. Examples of such substrates are very low sulfur (<1 ppm) single crystal superalloys, such as PWA 1487 and Rene N5, which also contain 0.1% yttrium to enhance adhesion of the thermally grown alumina scale.

The ceramic coat 16 consists of a mixture of two or more individual oxides. For purposes of description, some of these oxides will be termed "solvent", while the other(s) will be termed "solute". Note that in this description the term solute does not necessarily mean that one particular oxide is completely dissolved in the solvent material. Within the scope of the present disclosure, the solute oxide may be in the form of solid solution and may also be in the form of a separate oxide compound (phase).

The solvent may be any of the conventional ceramic compositions used for thermal barrier coatings. A preferred solvent composition is yttria stabilized zirconia (YSZ), which is essentially a solid solution of $Y_2O_3$ in $ZrO_2$. Alternatively, zirconia may be stabilized with CaO, MgO, $CeO_2$, as well as the noted $Y_2O_3$ and other oxides of rare earth metals, such as ytterbium, dysprosium, or neodymium. In addition, two or more stabilizers may be present together forming a more complex solvent material. Another ceramic solvent believed to be useful as the coating material within the scope of the present disclosure is hafnia, which can also contain the above mentioned stabilizers.

The purpose of adding solute to the coating is to decrease thermal conductivity of the TBC. The solute material may be a different oxide or a mixture of oxides, for example, $Ta_2O_5$ and/or $Nb_2O_5$.

The whole ceramic material coat 16 should be both chemically and thermodynamically stable in the high temperature environment of a gas turbine. The thickness of the ceramic layer may vary from about 10 to about 1000 microns but is typically in the about 50 to about 300 microns range.

The ceramic coat 16, in one example, is applied by EB-PVD and has a columnar microstructure. The columns 18 are oriented substantially perpendicular to the surface of the substrate 10 and extend outward from the bond coat 12. Between the individual columns 18 are micron and sub-micron sized intercolumnar gaps 20 that extend from the outer surface of the ceramic coat 16 to the alumina layer 14. It should be appreciated that the gaps are only illustrated in FIG. 1. The actual gaps are not necessarily bounded by straight walls as shown and need not have a constant width. Additionally, some existing gaps may disappear, while other new gaps may appear throughout the coating thickness. In another example, the ceramic coat 16 is applied by another deposition technique, such as air plasma spray (APS) techniques or directed vapor deposition techniques, among other suitable deposition techniques known in the art. In embodiments wherein APS or other deposition techniques are employed, it is expected that columns 18 will not be present in the ceramic coat 16.

FIG. 1 further illustrates a portion 26 of the coating 16 adjacent to the alumina layer 14, wherein the coating composition is different from the rest of the TBC so that the concentration of the solute material is reduced to zero. This portion 26 may or may not be present in all embodiments in accordance with the present disclosure, and is merely described in connection with FIG. 1 for purposes of illustrating an exemplary embodiment. The percentage of yttria in portion 26 is on the order of about 7 to about 8 weight percent. The portion 26 comprises from 0 (in embodiments where portion 26 is not present) to about 50% of the total TBC thickness and is preferably between 10 and 20 microns in thickness. Overlying the portion 26 is a second portion 28, which has the properties of the majority of the coating 16, as described above. Of course, if portion 26 is not present in an embodiment, i.e., where it comprises 0% of the thickness of coating 16, the second portion 28 will be adjacent to the alumina layer 14.

Deposition of a multi-component oxide using EB-PVD method poses significant challenges, particularly because the coating often becomes locally enriched or depleted with different constituents, which leads to chemistry variation across the coating thickness. This is especially true in the case of oxides having vastly different physical properties, such as melting temperatures or vapor pressures. This problem has been known in the art for a number of years, and has evaded solution despite numerous attempts to deposit the coating in a more even manner.

The Applicants herein hypothesized that if the solute in the coating is more or less dense than the solvent, it would tend to enrich or denude the surface of the molten pool, which exists on the top of the multi-component evaporation source during a deposition process, such as an EB-PVD process. In turn, the vapor cloud would become enriched or depleted, according to the surface composition of the molten pool. Thus, the coating deposited on the substrate would become locally enriched or depleted relative to the desired TBC chemistry.

Based on this hypothesis, the Applicants herein have discovered that the use of a solute in the coating that has a density more similar to the solvent (YSZ) results in less variation in the coating. Whereas the densities of the constituents of the YSZ solvent are between about 5.0 and about 5.7 g/cm$^3$, the densities of other oxides that could be used as solute may be much higher or lower. One embodiment of the present disclosure provides a solution to this long-felt problem by selecting a compatible solute and solvent with similar densities. For example, $Nb_2O_5$, which has a density of 4.6 g/cm$^3$ (much closer to the YSZ solvent), may be employed as the solute with YSZ being the solvent. In effect, this would keep the density of the solute and solvent between about 4.6 and about 5.7 g/cm$^3$, depending on the desired TBC composition, which has been discovered to lead to a more stable melt pool and more homogeneous evaporation and deposition onto the target substrate. The concentration range of $Nb_2O_5$ within the YSZ grains is 0.5 to 35 weight percent, with a range of about 15 to about 20 percent preferred.

As such, in the embodiment described above, the solute ($Nb_2O_5$) is selected to have a density that is more near the solvent (YSZ). In another exemplary embodiment, an alternative solvent may be employed that has a density that is more near another solute employed. For example, for a much heavier solute $Ta_2O_5$, having the density of about 8.2 g/cm$^3$, a different solvent may be selected to more closely match its density. The Applicants herein have thus discovered that ytterbia stabilized hafnia (YbSH: a system of $Yb_2O_3$ and $HfO_2$) which have densities of about 9.2 and 9.68 g/cm$^3$, respectively, provides a better match with $Ta_2O_5$. In effect, a combination of tantala and YbSH would keep the density of the solute and solvent between about 8.2 and 9.7 g/cm$^3$, which leads to a more stable melt pool and more homogenious evaporation and deposition onto the target substrate. Also, the higher density in this embodiment is expected to decrease the conductivity of the TBC due to the larger atomic mass of the constituents.

In a more general form, for some other solute that can be described by a general oxide formula, $X_aO_b$, where X is a metallic element, O is oxygen, and "a" and "b" are stoichiometric coefficients, the density of the solvent can be adjusted by mixing zirconia and hafnia in a certain proportion, thus creating a complex solvent with a matching density. Likewise, the stabilizing oxides (yttria, ytterbia, neodymia, etc.) can also be mixed in a certain proportion to formulate an oxide mixture having a desired density. As is known in the art, the term "stabilizing oxide" refers to an oxide added to zirconia or hafnia, or a mixture thereof in order to retain the tetragonal phase during service.

In one particular embodiment in accordance with FIG. 1, in portion 26 of the columns 18 adjacent the alumina layer 14, the coating composition is between about 7 to about 8 weight percentage of yttria stabilized zirconia. Overlying the portion 26 is the second portion 28 of columnar coating with hafnia solvent preferably stabilized with a percentage of ytterbia in the range of about 10 to about 30 weight percent and tantala solute with a concentration range between about 10 to about 30 weight percent.

Thus, embodiments of the present disclosure provide a coating with a stabilized zirconia or hafnia oxide (solvent) and an additional oxide (solute), wherein the difference in density between the solvent (or individual components thereof) and the solute is less than about 30%, for example less than about 25%, such as less than about 20%. In other embodiments, the solvents and solutes, as described above, are provided such that that the density of the solvent (or individual components thereof) and the solute is approximately equal, for example having a density difference of less than 10%, or less than 5%.

Accordingly, the exemplary embodiments described herein provide an improved low conductivity thermal barrier coating. The embodiments described herein provide low conductivity thermal barrier coatings that do not suffer chemistry variations within the coating. Further, the embodiments described herein provide low conductivity thermal barrier coatings wherein the solute maintains a consistent concentration across the coating thickness. The coatings provide thermal protection for turbine airfoils, shrouds, and combustor components, or segments thereof.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. Various changes may be made in the function and arrangement of elements described in an exemplary embodiment without departing from the scope of the invention as set forth in the appended claims.

What is claimed is:

1. A ceramic composition of matter consisting of:
   a solvent material and a solute material,
   wherein the solvent material consists of ytterbia stabilized hafnia or yttria stabilized zirconia,
   wherein the solute material consists of a metal oxide of the formula, $X_aO_b$, where X is a metallic element, O is oxygen, and "a" and "b" are stoichiometric coefficients, and wherein the solute material is present in a concentration range from about 10 wt.-% to about 30 wt.-%, and wherein the difference in density between each of the solvent material and the solute material is less than 10%.

2. The ceramic composition of matter of claim 1, wherein the ceramic composition of matter is produced using electron beam physical vapor deposition.

3. The ceramic composition of matter of claim 1, wherein the solute is partially dissolved in the solvent.

4. The ceramic composition of matter of claim 1, wherein the solute is a solid solution within the solvent.

5. The ceramic composition of matter of claim 1, wherein the metallic element "X" is selected from the group consisting of: tantalum, niobium, and mixtures thereof.

6. The ceramic composition of matter of claim 1, wherein the difference in density between each of the solvent material and the solute material is less than 5%.

7. The ceramic composition of matter of claim 1, wherein the ceramic composition of matter comprises a columnar structure.

8. A superalloy article having a ceramic thermal barrier coating on at least a portion of its surface, comprising:
   a superalloy substrate comprising nickel, cobalt, iron, or a mixture thereof;
   a bond coat overlying the substrate and selected from the group consisting of: aluminides, and MCrAlY, wherein M is a metal selected from the group consisting of: cobalt, nickel, and mixtures thereof; and
   a columnar ceramic coat over the bond coat, the ceramic coat consisting of a solvent material and a solute material,
   wherein the solvent material consists of ytterbia stabilized hafnia or yttria stabilized zirconia,
   wherein the solute material consists of a metal oxide of the formula, $X_aO_b$, where X is a metallic element, O is oxygen, and "a" and "b" are stoichiometric coefficients, and wherein the solute material is present in a concentration range from about 10 wt.-% to about 30 wt.-%, and
   wherein the difference in density between each of the solvent material and the solute material is less than 10%.

9. The superalloy article of claim 8, wherein the superalloy article comprises a turbine airfoil, or shroud, or combustor component, or a segment thereof.

10. The superalloy article of claim 8, wherein the difference in density between the solvent material and the solute material is less than 5%.

11. A ceramic composition of matter consisting of:
    a solvent material and a solute material,
    wherein the solvent material consists of hafnia stabilized with a stabilizing oxide or wherein the solvent material consists of zirconia stabilized with a stabilizing oxide,
    wherein the solute material consists of a metal oxide of the formula, $X_aO_b$, where X is a metallic element, O is oxygen, and "a" and "b" are stoichiometric coefficients, and wherein the solute material is present in a concentration range from about 10 wt.-% to about 30 wt.-%, and
    wherein the difference in density between each of the solvent material and the solute material is less than 10%.

12. The ceramic composition of matter of claim 11, wherein the stabilizing oxide is selected from the group consisting of: yttria, ytterbia, neodymia, calcium oxide, magnesium oxide, ceria, dysprosia, and a mixture thereof.

13. The ceramic composition of matter of claim 12, wherein the metallic element "X" is selected from the group consisting of: tantalum, niobium, and mixtures thereof.

14. The ceramic composition of matter of claim 11, wherein the metallic element "X" is selected from the group consisting of: tantalum, niobium, and mixtures thereof.

* * * * *